United States Patent
Anh et al.

(10) Patent No.: US 7,233,054 B1
(45) Date of Patent: Jun. 19, 2007

(54) PHASE CHANGE MATERIAL AND NON-VOLATILE MEMORY DEVICE USING THE SAME

(75) Inventors: Dong Ho Anh, Seoul (KR); Tae-Yon Lee, Seoul (KR); Ki Bum Kim, Seoul (KR); Byung-ki Cheong, Seoul (KR); Dae-Hwan Kang, Seoul (KR); Jeung-hyun Jeong, Seoul (KR); In Ho Kim, Seoul (KR); Taek Sung Lee, Seoul (KR); Won Mok Kim, Seoul (KR)

(73) Assignees: Korea Institute of Science and Technology (KR); Seoul National University Industry Foundation (KR)

( * ) Notice: Subject to any disclaimer, the term of this patent is extended or adjusted under 35 U.S.C. 154(b) by 0 days.

(21) Appl. No.: 11/290,713

(22) Filed: Nov. 29, 2005

(51) Int. Cl.
*H01L 29/12* (2006.01)

(52) U.S. Cl. .............................. 257/613; 257/3; 257/4; 257/5; 257/200; 257/246; 438/752

(58) Field of Classification Search ................... None
See application file for complete search history.

(56) References Cited

U.S. PATENT DOCUMENTS

2006/0091374 A1* 5/2006 Yoon et al. ................... 257/2

* cited by examiner

*Primary Examiner*—Leonardo Andujar
*Assistant Examiner*—Scott R. Wilson
(74) *Attorney, Agent, or Firm*—Anderson Kill & Olick, PC

(57) ABSTRACT

The present invention provides a phase change memory cell comprising $(Ge_ASb_BTe_C)_{1-X}(R_aS_bTe_c)_X$ solid solution, the solid solution being formed from a Ge—Sb—Te based alloy and a ternary metal alloy R—S—Te sharing same crystal structure as the Ge—Sb—Te based alloy. A nonvolatile phase change memory cell in accordance with the present invention provides many advantages such as high speed, high data retention, and multi-bit operation.

9 Claims, 6 Drawing Sheets

US 7,233,054 B1

PHASE CHANGE MATERIAL AND NON-VOLATILE MEMORY DEVICE USING THE SAME

FIELD OF THE INVENTION

The present invention relates to a non-volatile memory device using a phase change material.

BACKGROUND OF THE INVENTION

In recent years, there has been a renewal of interest in phase change random access memory (PCRAM) as a promising candidate for next generation nonvolatile memory device because of many advantages such as non-volatility, fast operation property, process simplicity and possibility of multi-bit operation.

Traditionally, PCRAM employs a chalcogenide-based phase change material such as a stoichiometric Ge—Sb—Te alloy like $Ge_2Sb_2Te_5$. A Ge—Sb—Te based alloy is capable of storing information in a binary form by electrically switching between the amorphous and crystalline states in a reversible manner.

Despite its merits as nonvolatile phase change memory material, however, a Ge—Sb—Te based alloy is disadvantageous as it tends to yield slow writing speed. For instance, it takes about 100 ns for the completion of the phase change from the amorphous (high resistance) to the crystalline (low resistance) states when a Ge—Sb—Te based alloy is employed. It takes ordinarily less than 100 ns in the reverse direction. On the other hand, conventional DRAM (dynamic random access memory), SRAM (static random access memory) and MRAM (magnetic random access memory) show the writing time of ~50 ns, ~8 ns and ~10 ns, respectively. Therefore, efforts should be made if PCRAM is to be used for high speed applications.

In addition, there is a stability problem associated with thermal interference between adjacent memory cells.

To store information in a binary form, memory cell exploits the difference in electrical resistance between crystalline and amorphous states. Specifically, in order to write '1' state (reset state) in a single cell, an electric voltage or current pulse is applied between the top and bottom electrodes contacting a phase change material, which induces direct or indirect heating on the phase change material for melting thereof. Upon termination of the electric pulse, the molten phase change material is quenched to an amorphous state, thereby writing the state '1' in a single cell.

With density of PCRAM growing higher, binary data stored in amorphous memory cells may be corrupted with ease by unintended crystallization as a result of the heat generated in an adjoining memory cell which undergoes melting during a reset process thereof.

Nitrogen or silicon may be added to a Ge—Sb—Te based alloy for raising the crystallization temperature thereof. However, the addition of impurities may slow the crystallization process (B. J. Kuh et al, EPCOS 2005).

Further, integrating the memory device by sizing down the cell area is inherently bound by the limits of photolithographic techniques. In U.S. Pat. No. 5,414,271, it is disclosed that data can be stored in multi-bit forms by controlling the ratio between the amorphous and crystalline states in a single cell unit. However, it is extremely hard to control the dispersion between these two states.

Accordingly, it is imperative to find a way for storing multi-bit information in a single cell unit.

SUMMARY OF THE INVENTION

It is, therefore, an object of the present invention to provide a non-volatile phase change memory cell devoid of at least one of the aforementioned problems, and a memory device using the same.

In accordance with the present invention, there is provided a non-volatile phase change memory cell comprising a compound having the formula $(Ge_ASb_BTe_C)_{1-x}(R_aS_bTe_c)_x$, wherein Ge is germanium; Sb is antimony; Te is tellurium; R is an element selected from the elements belonging to the IVB group in the periodic table; S is an element selected from the elements belonging to the VB group in the periodic table; A, B, C, a, b and c are atomic mole ratios; x is a mole fraction in the range of 0 to 1; $R_aS_bTe_c$ has same crystal structure as $Ge_ASb_BTe_C$; and at least one element of R and S has a higher atomic number and thus a smaller diatomic bond strength than that of the corresponding element in the GeSb portion of Ge—Sb—Te.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
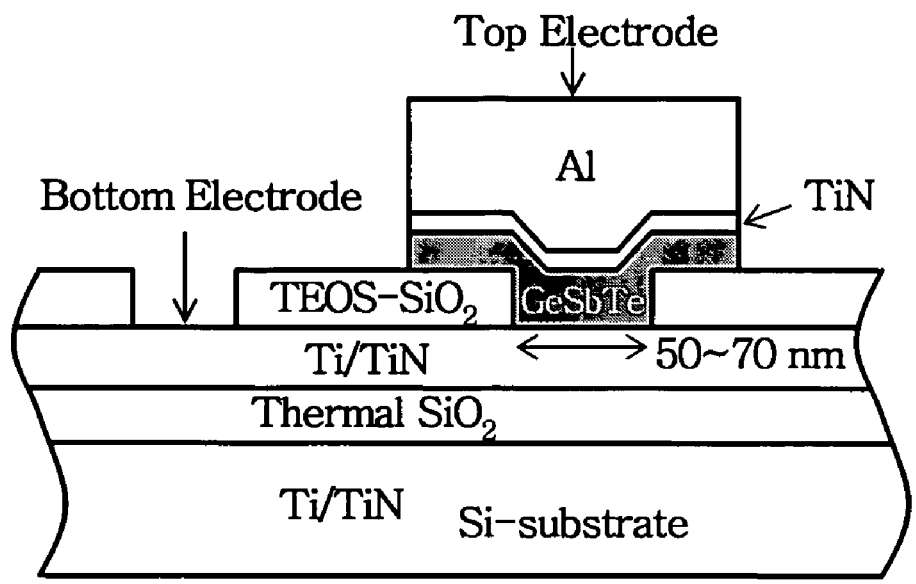
FIG. 1 describes a schematic diagram of a phase change memory cell including a material in accordance with the present invention.

The preferred embodiment of the present invention will now be explained.

A phase change memory cell according to the present invention comprises a ternary alloy of R—S—Te which forms a homogeneous pseudo-binary solid solution with a Ge—Sb—Te alloy.

Specifically, the phase change memory cell of the present invention comprises a composition having the formula $(Ge_ASb_BTe_C)_{1-x}(R_aS_bTe_C)_x$, wherein Ge is germanium; Sb is antimony; Te is tellurium; R is an element selected from the elements belonging to the IVB group in the periodic table; S is an element selected from the elements belonging to the VB group in the periodic table; A, B, C, a, b and c are atomic mole ratios; x is a mole fraction in the range of 0 to 1; $R_aS_bTe_C$ has the same crystal structure as $Ge_ASb_BTe_C$; and at least one element of R and S has a higher atomic number and thus a smaller diatomic bond strength than that of the corresponding element in the GeSb portion of Ge—Sb—Te.

In one embodiment, the Ge—Sb—Te alloy may be a stoichiometric compound alloy of Ge, Sb and Te, preferably selected from the group of $Ge_4Sb_1Te_5$, $Ge_2Sb_2Te_5$, $Ge_1Sb_2Te_4$, and $Ge_1Sb_4Te_7$. Therefore, it is preferable that a combination of A, B and C is selected from the group consisting of (4, 1, 5), (2, 2, 5), (1, 2, 4) and (1, 4, 7), the combination being limited to the sequence expressed in parenthesis in that order.

In one embodiment, the R—S—Te ternary alloy is stoichiometrically equivalent to the Ge—Sb—Te alloy.

A stoichiometric compound alloy tends to have fast kinetics of an amorphous to crystalline transformation for the following reasons: the alloy tends to have a high atomic mobility effected by its large thermodynamic driving force of an amorphous to crystalline transformation; the alloy tends to crystallize into a single phase, requiring only short-range atomic reconfiguration with no need of long-range atomic diffusion indispensable to phase separation. Therefore, it is preferable that R—S—Te alloy has the same stoichiometric composition as the compound Ge—Sb—Te alloy so that an amorphous to crystalline transformation in a solid solution of R—S—Te and Ge—Sb—Te alloys would proceed rapidly likewise.

In addition, R and S are elements belonging to the IVB and VB group in the periodic table, respectively, and the diatomic bond strength of at least one of R and S is smaller than that of the corresponding element of the Ge—Sb—Te portion. J. H. Coombs, et al. [J. Appl. Phys., 78, 4918(1995)] studied crystallization kinetics of Ge—Sb—Te alloys in which a part of Ge is replaced with Sn, or a part of Te is replaced with Sulfur or Se.

According to these studies, the nucleation kinetics increases when a part of Ge is replaced with Sn whose single bond energy is smaller than that of Ge, whereas the nucleation kinetics decreases when a part of Te is replaced with Sulfur or Se whose single bond energy is larger than that of Te. From these studies, it is apparent that the diatomic bond strength of each constituent element plays an important role in crystallization kinetics.

Therefore, in order to increase the crystallization kinetics, it is preferred that at least one of R and S has a higher atomic number and thus a smaller diatomic bond strength than that of a corresponding element in the GeSb portion of Ge—Sb—Te alloy. Thus, R is preferably Sn or Pb, and S is preferably Bi.

When the crystalline phases of both $R_aS_bTe_C$ and Ge—Sb—Te alloys have the same space group symmetry with slightly different lattice parameters, a pseudo-binary solid solution can form with a complete solubility between two alloys. Table 1 shows a list of the preferable $R_aS_bTe_C$ alloys for each of the stoichiometric compound Ge—Sb—Te alloys.

TABLE 1

| Compound | Space Group Sym. (Pearson Symbol) | Lattice Parameters (nm) | |
|---|---|---|---|
| $Ge_4Sb_1Te_5$ | Fm-3m (cF8) | a = 0.6 | |
| [1]$Pb_4Bi_1Te_5(Pb_{39}Bi_9Te_{52})$ | | 0.6415 | |
| [2]$Sn_4Bi_1Te_5(Sn_{38}Bi_{12}Te_{50})$ | | 0.63 | |
| $Ge_2Sb_2Te_5$ | P-3ml (hP9) | a = 0.42 | c = 1.70 |
| $Pb_2Bi_2Te_5$ | | 0.446 | 1.75 |
| $Ge_1Sb_2Te_4$ | R-3m (hR7) | a = 0.421 | c = 4.06 |
| $Ge_1Bi_2Te_4$ | | 0.428 | 3.92 |
| $Pb_1Bi_2Te_4$ | | 0.416 | 3.92 |
| $Sn_1Bi_2Te_4$ | | 0.4411 | 4.15 |
| $Sn_1Sb_2Te_4$ | | 0.4294 | 4.16 |

TABLE 1-continued

| Compound | Space Group Sym. (Pearson Symbol) | Lattice Parameters (nm) | |
|---|---|---|---|
| $Ge_1Sb_4Te_7$ | P-3ml (hP12) | a = 0.421 | c = 2.37 |
| $Ge_1Bi_4Te_7$ | | 0.4352 | 2.39 |
| [3]$Pb_1Bi_4Te_7$ | | 0.446 | 2.36 |
| [4]$Sn_1Bi_4Te_7(Sn_{12}Bi_{38}Te_{50})$ | | 0.4395 | 2.44 |

Note:
1: $(Bi_2Te_3)_x(PbTe)_{1-x}$, a = 0.64564–0.64151 nm for x = 0–0.1,
2: $Bi_{1-x}Sn_xTe_1$, a = 0.6300–0.6316 nm for x = 0.75–1,
3: three other crystal structures are also known,
4: $Bi_{1-x}Sn_xTe_1$, a = 0.4448–0.4395 nm, c = 2.427–2.436 nm for x = 0–0.25; $Sn_1Bi_4Te_7$ itself has the symmetry of R-3m(hR7).

According to the present invention, the atomic mole ratios may deviate from the aforementioned values to the extent that a solid solution of R—S—Te and Ge—Sb—Te alloys can form a single crystalline phase, or multiple phases with a predominant crystalline phase of preferably equal to or more than 90% in volume.

R—S—Te alloy sharing the same crystal structure as Ge—Sb—Te alloy not only accelerates the crystallization of Ge—Sb—Te based alloy through forming a complete solid solution alloy therewith but also changes the basic concept of a binary phase change memory element which has amorphous and crystalline face-centered-cubic (fcc) states.

For instance, cell resistance does not return to that of an original crystalline state ($1^{st}$ SET value) but rather drops further to the $2^{nd}$ SET value when an electric pulse is applied to the $(Ge_1Sb_2Te_4)_{0.8}(R_1S_2Te_4)_{0.2}$ film in a virgin amorphous state. It was also discovered that the cell resistance changes reversibly between $1^{st}$ SET and $2^{nd}$ SET since then.

Accordingly, data can be stored in different forms of crystalline phases. Transition of cell resistance from low conducting crystalline state (fcc) to high conducting crystalline hexagonal state and vice-versa is very abrupt and fast, and also each cell resistance value corresponds the resistivity of each phase. The mechanism is suggested by Dong-ho Ahn et al. (IEEE electron device letters, Vol. 26, No. 5), which is incorporated herein by reference.

Present inventors also discovered that three phases of amorphous, fcc and hexagonal crystalline states may be accessible for data storage if the amount of R—S—Te based alloy introduced is reduced to, e.g., $(Ge_1Sb_2Te_4)_{0.9}(R_1S_2Te_4)_{0.1}$.

Specific aspects of the present invention are further illustrated through the following Examples, without limiting the scope thereof.

EXAMPLE 1

Figure 2:
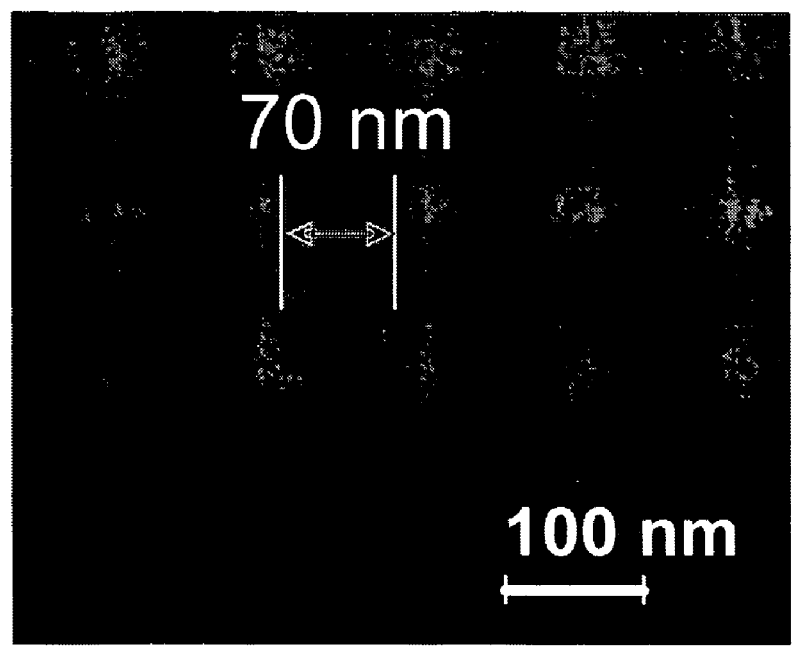
FIG. 2 shows a planar view of 70 nm contact pore by SEM.

An off-set type phase change memory cell as shown in FIG. 1 was prepared according to the following procedures. 200 nm-thick $SiO_2$ film was deposited on silicon substrate. Ti/TiN film, as a bottom electrode, was deposited thereon at a thickness of 100 nm, respectively. Next, 100 nm-thick $SiO_2$ was formed thereon. As shown in SEM picture of FIG. 2, a contact hole of 70 nm was formed by electron beam lithography.

Next, as a phase change material, solid solution of $(Ge_1Sb_2Te_4)_{0.8}(Sn_1Bi_2Te_4)_{0.2}$ was deposited in the contact hole by PVD (physical vapor deposition) at a thickness of 100 nm. As top electrodes, 100 nm-thick TiN and 500 nm-thick Al films were sequentially deposited on the phase change material.

FIG. 1 describes a schematic diagram of an off-set type phase change memory cell including a material in accordance with the present invention. Transistor part for cell addressing is not shown in FIG. 1.

Figure 3:
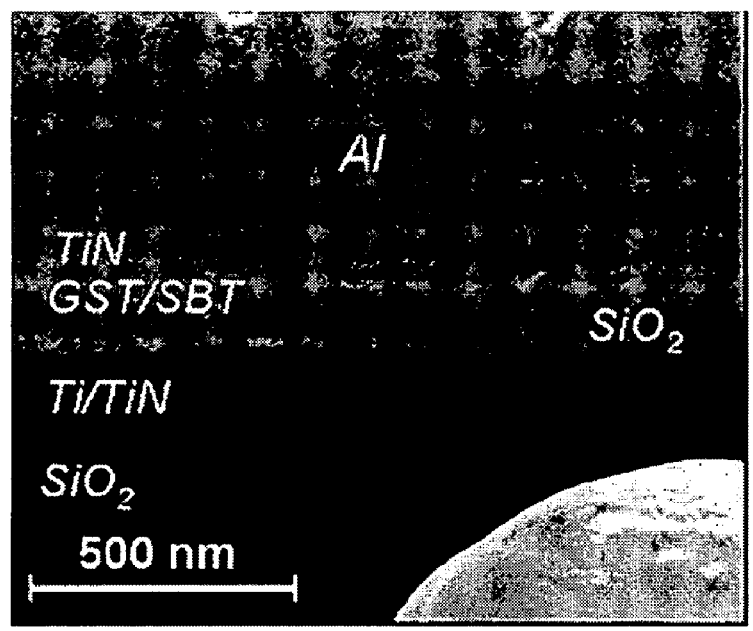
FIG. 3 illustrates sectional SEM picture of a phase change memory cell including a material in accordance with the present invention.

FIG. 3 illustrates sectional SEM picture of a phase change memory cell including a material in accordance with the present invention.

EXAMPLE 2

Procedures in Example 1 were repeated except that a solid solution of $(Ge_1Sb_2Te_4)_{0.9}(Sn_1Bi_2Te_4)_{0.1}$ was used instead of $(Ge_1Sb_2Te_4)_{0.8}(Sn_1Bi_2Te_4)_{0.2}$.

COMPARATIVE EXAMPLE

Procedures in Example 1 were repeated except that $Ge_1Sb_2Te_4$ alloy was employed as a phase change material instead of the solid solution.

Evaluation of DC I-V Characteristics, Resistance and Operational Speed

Figure 4A:
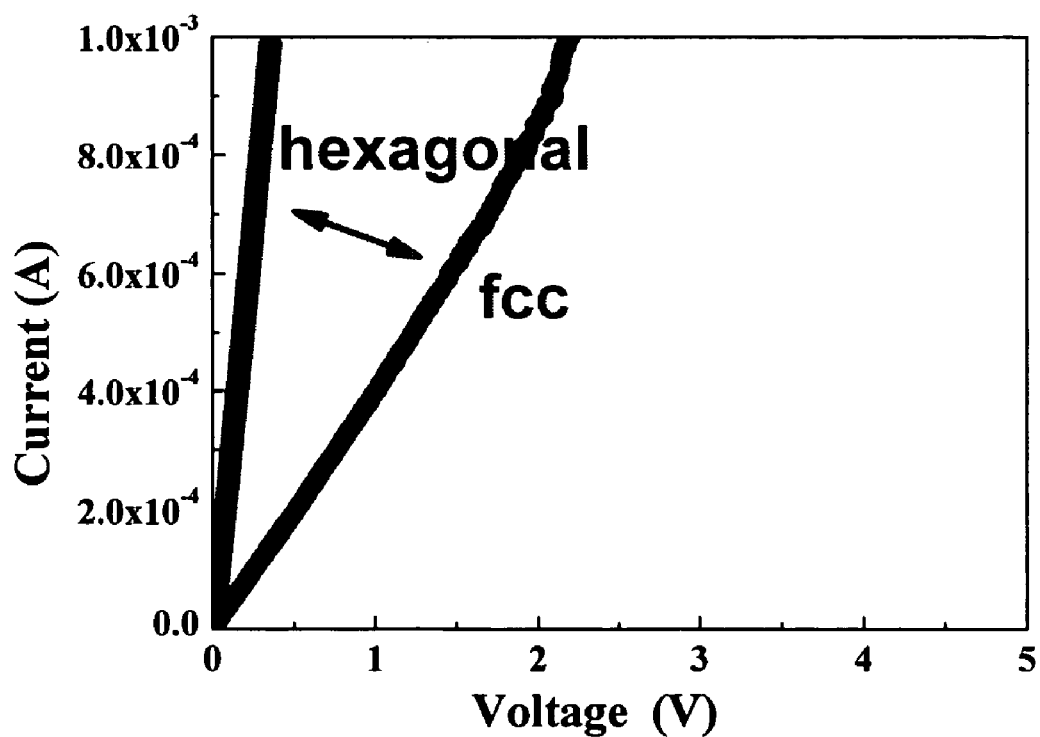
FIGS. 4a, 4b and 4c offer DC I-V characteristics of $(Ge_1Sb_2Te_4)_{0.8}(R_1S_2Te_4)_{0.2}$, $(Ge_1Sb_2Te_4)_{0.9}(R_1S_2Te_4)_{0.1}$ and $Ge_1Sb_2Te_4$, respectively.
Figure 4B:
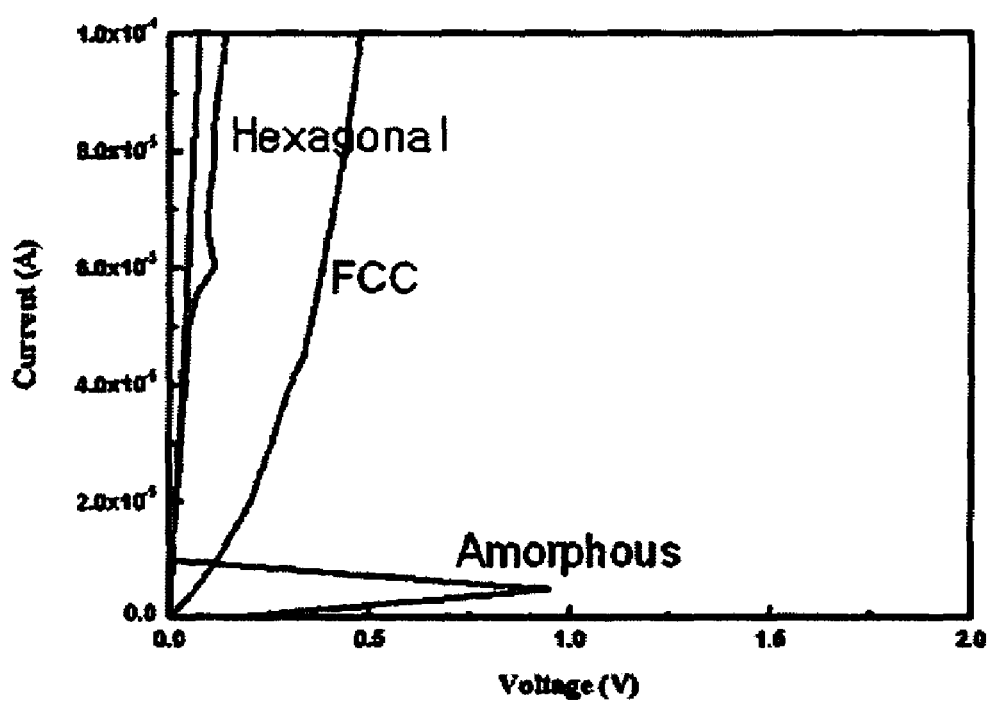
Figure 4C:
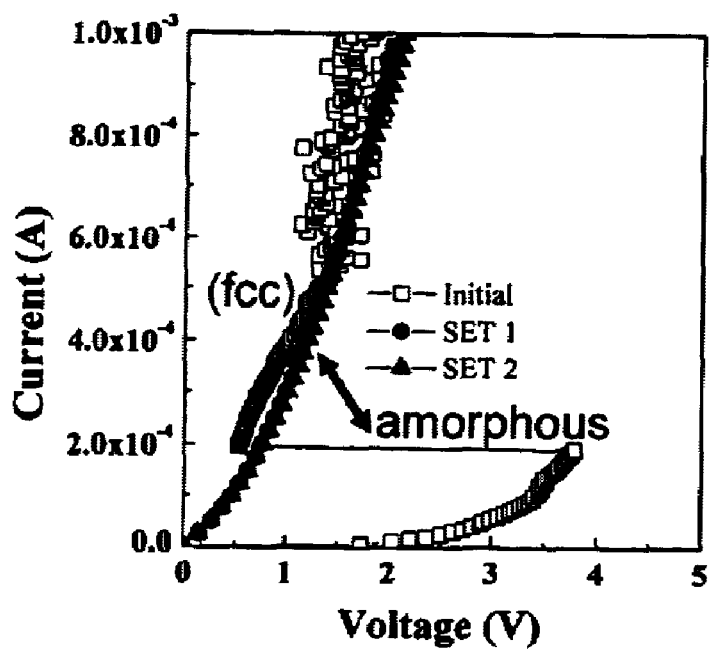

DC I-V characteristics were measured with Agilent 4156C for the samples prepared in Examples 1, 2 and Comparative Example as shown in FIGS. 4a, 4b and 4c, respectively.

In FIGS. 4a to 4c, typical DC I-V curve of the crystalline-amorphous states was observed when only $Ge_1Sb_2Te_4$ was employed (FIG. 4c). For the sample employing $(Ge_1Sb_2Te_4)_{0.8}(Sn_1Bi_2Te_4)_{0.2}$ as the phase change material (Example 1), DC I-V curve revealed just the features of fcc and hexagonal crystalline states without negative resistance characteristics of amorphous state (FIG. 4a).

On the other hand, all three phases of amorphous, fcc and hexagonal crystalline states were present as shown in the curve of FIG. 4b when $(Ge_1Sb_2Te_4)_{0.9}(Sn_1Bi_2Te_4)_{0.1}$ was employed as the phase change material (Example 2).

Figure 5A:
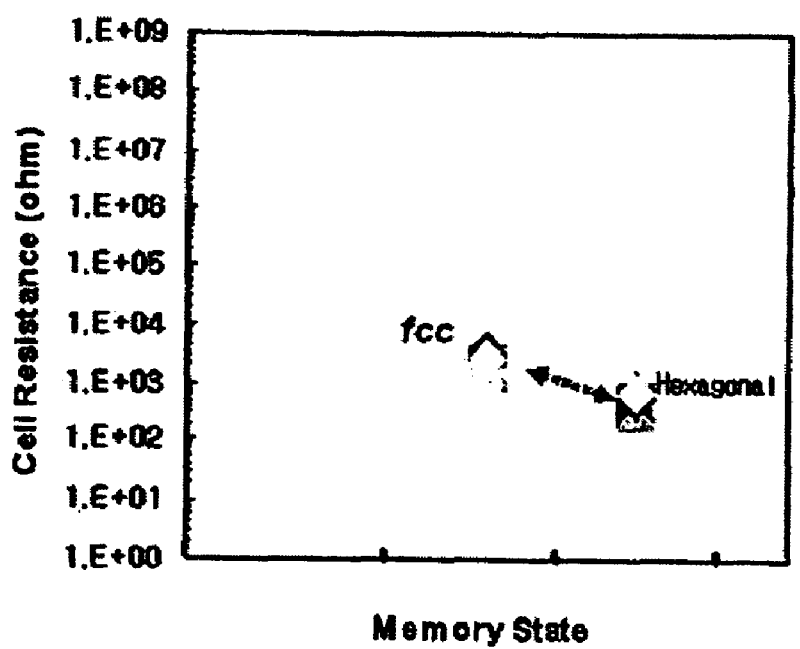
FIGS. 5a, 5b and 5c delineate resistances of memory cells having $(Ge_1Sb_2Te_4)_{0.8}(R_1S_2Te_4)_{0.2}$, $(Ge_1Sb_2Te_4)_{0.9}(R_1S_2Te_4)_{0.1}$ and $Ge_1Sb_2Te_4$, respectively.
Figure 5B:
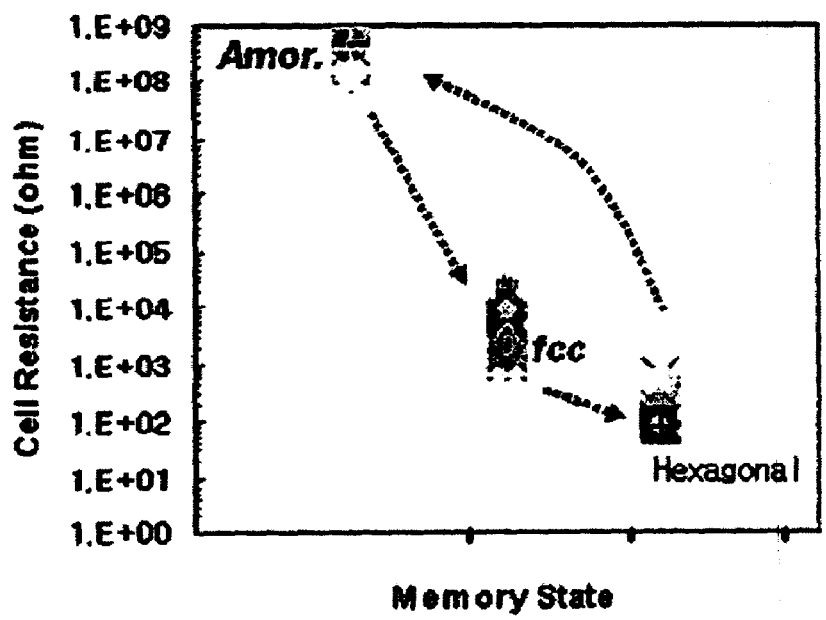
Figure 5C:
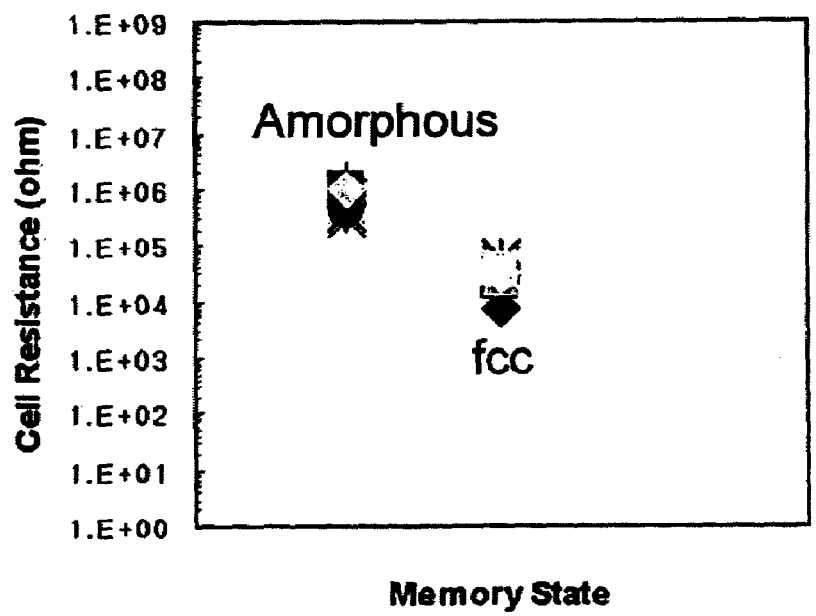

Further, resistances of the samples were measured with Agilent 4156C, results being shown in FIGS. 5a, 5b and 5c.

As shown in FIG. 5c, the resistances of the amorphous and fcc states of Comparative Example were each $10^6$ ohm and $10^4$ ohm, showing two orders of magnitude difference.

On the other hand, the resistances of the fcc and hexagonal crystalline states of Example 1 were each $10^3$ ohm and $10^2$ ohm as shown in FIG. 5a. The resistance gap of sample from Example 1, i.e. $(Ge_1Sb_2Te_4)_{0.8}(Sn_1Bi_2Te_4)_{0.2}$, was smaller than Comparative Example where pure $Ge_1Sb_2Te_4$ was employed. However, it still has one order of magnitude, which is large enough to provide distinguishable binary memory states.

As shown in FIG. 5b, resistances of the amorphous, fcc and hexagonal crystalline states of Example 2 were $10^8$, $10^4$ and $10^2$ ohms, respectively. Accordingly, all three states of Example 2 were distinguishable by two or four orders of magnitude.

Figure 6:
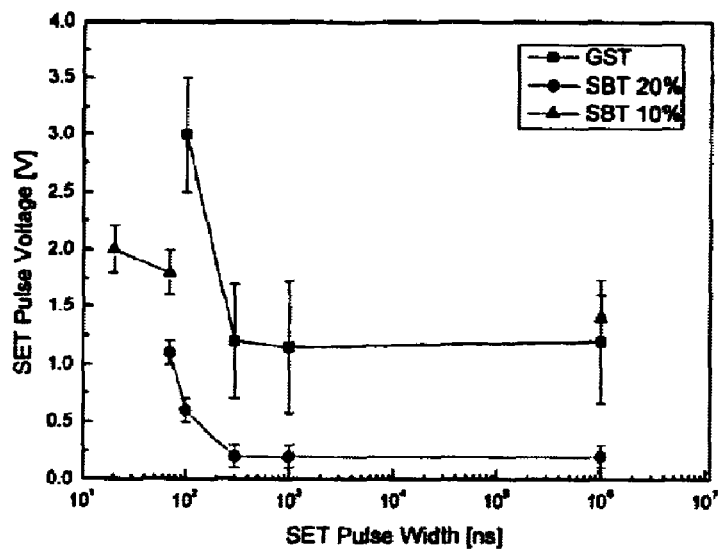
FIG. 6 demonstrates relationship between SET pulse voltage characteristics and SET pulse width.

FIG. 6 demonstrates relationship between SET pulse voltage characteristics and SET pulse width as measured with Agilent 81110A.

SET pulse width in FIG. 6 is equivalent to the speed of the set operation of the device. The duration for the phase change of Comparative Example was shown to be 100 ns or more while that of Example 2 was shown to be 20 ns between its amorphous and fcc states. Duration of fcc-hexagonal phase change of Example 1 was 70 ns.

Figure 7:
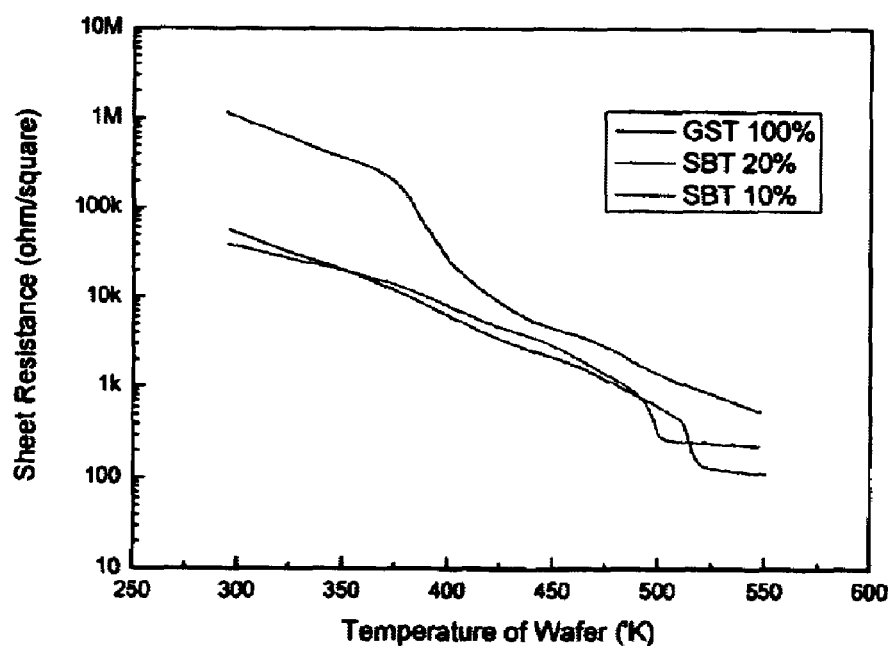
FIG. 7 outlines change in sheet resistance with respect to the temperature of heat treatment.

FIG. 7 outlines change in sheet resistance with respect to the temperature of heat treatment as measured with Agilent 4156C. Sheet resistance drops at phase change temperature.

By this standard, phase change temperatures of Examples 1, 2 and Comparative Example were determined to be 210, 230 and 110° C., respectively.

Test results of Examples are summarized in Table 2 below.

TABLE 2

| | Resistance after phase change | | | Speed of phase change | | Phase change temperature | |
|---|---|---|---|---|---|---|---|
| | A* | fcc | hex | A→fcc | fcc→hex | A→fcc | fcc→hex |
| Example 1 | — | ~$10^3$ | ~$10^2$ | — | 70 ns | — | 210° C. |
| Example 2 | ~$10^8$ | ~$10^4$ | ~$10^2$ | 20 ns | 70 ns | — | 230° C. |
| Comparative Example | ~$10^6$ | ~$10^4$ | — | 100 ns | ~10 μs | 110° C. | Above 300° C. |

*A and hex indicate amorphous and crystalline hexagonal states of $Sn_1Bi_2Te_4$, respectively.

In summary, considerable advantages can be expected by employing solid solution of 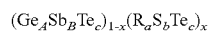 in a memory cell in accordance with the present invention.

For instance, the cell of Example 1 is stable against data corruption since the phase change temperature is higher than that in a conventional cell by as much as 100° C.

If the cell of Example 2 is employed, multi-bit information storage is enabled with three discrete phases available in a single cell unit. Both cells in Examples 1 and 2 present fast recording/deleting of data.

While the invention has been shown and described with respect to the preferred embodiment, it will be understood by those skilled in the art that various changes and modification may be made without departing from the spirit and scope of the invention as defined in the following claims.

What is claimed is:

1. A non-volatile phase change memory cell comprising a compound having the following formula:

$$(Ge_ASb_BTe_C)_{1-x}(R_aS_bTe_c)_x$$

wherein, Ge is germanium; Sb is antimony; Te is tellurium; R is an element selected from the elements belonging to the IVB group in the periodic table; S is an element selected from the elements belonging to the VB group in the periodic table; A, B, C, and a, b and c are atomic mole ratios satisfying the condition that the R—S—Te alloy part is stoichiometrically equivalent to the Ge—Sb—Te alloy part; x is a mole fraction in the range of 0 to 1; $R_aS_bTe_c$ has the same crystal structure as $Ge_ASb_BTe_C$; and at least one element of R and S has a higher atomic number and a smaller diatomic bond strength than that of the corresponding element in the GeSb portion of Ge—Sb—Te.

2. The non-volatile phase change memory cell of claim 1, wherein R is Sn or Pb and S is Bi.

3. The non-volatile phase change memory cell of claim 1, wherein a first combination of A, S and C and a second combination of a, b and c are the same with each other, and selected from the group consisting of (4, 1, 5), (2, 2, 5), (1, 2, 4) and (1, 4, 7), the combination being limited to the sequence expressed in parenthesis in that order.

4. The non-volatile phase change memory cell of claim 3, wherein both the first and the second combinations are (1, 2, 4).

5. The non-volatile phase change memory cell of claim 4, wherein X is around 0.2.

6. The non-volatile phase change memory cell of claim 4, wherein X is around 0.1.

7. The non-volatile phase change memory cell of claim 1, wherein the compound presents two crystalline phases of a face-centered-cubic (fcc) and a hexagonal states.

8. The non-volatile phase change memory cell of claim 1, wherein the compound presents three phases of an amorphous, a crystalline face-centered cubic (fcc) and a crystalline hexagonal state.

9. A memory device comprising the phase change memory cell of claim 1.

* * * * *